United States Patent [19]

Ligon

[11] 4,049,477

[45] Sept. 20, 1977

[54] METHOD FOR FABRICATING A SELF-ALIGNED METAL OXIDE FIELD EFFECT TRANSISTOR

[75] Inventor: Thomas R. Ligon, Loveland, Colo.

[73] Assignee: Hewlett-Packard Company, Palo Alto, Calif.

[21] Appl. No.: 663,170

[22] Filed: Mar. 2, 1976

[51] Int. Cl.² .............................................. H01L 21/22
[52] U.S. Cl. ..................................... 148/187; 148/186
[58] Field of Search ................................. 148/187, 186

[56] References Cited

U.S. PATENT DOCUMENTS

| 3,434,021 | 3/1969 | Hofstein | 148/187 X |
| 3,442,721 | 5/1969 | McCaldin et al. | 148/33 X |
| 3,899,372 | 8/1975 | Esch et al. | 148/187 |
| 3,910,804 | 10/1975 | Alcott | 148/187 X |

*Primary Examiner*—G. Ozaki
*Attorney, Agent, or Firm*—William E. Hein; Michael L. Sherrard

[57] ABSTRACT

An improved and simplified method of fabricating field effect transistors in metal oxide semiconductor integrated circuits advantageously employs the differential growth rate, under certain temperature conditions, between oxide on silicon wherein phosphorous has been diffused, and on silicon without such diffusion. The improved method of fabrication reduces the number of fabrication steps required, while simultaneously producing field effect transistors with superior operation speeds.

8 Claims, 10 Drawing Figures

IMPROVED METHOD

PRIOR ART

IMPROVED METHOD

METHOD FOR FABRICATING A SELF-ALIGNED METAL OXIDE FIELD EFFECT TRANSISTOR

BACKGROUND AND SUMMARY OF THE INVENTION

Field effect transistors (FETs) may be fabricated in metal oxide semiconductor (MOS) integrated circuits by diffusing phosphorous into two regions of a substrate of silicon which are to become the source and drain of the FET. These two regions, which now have the character of n-type material, are separated by a third region which will become the channel of the FET. A thin layer (approximately 1000 Angstroms) of silicon oxide ($SiO_2$) is grown over the channel region and a thick oxide layer (approximately 5000 Angstroms) is grown over the drain and source regions to isolate the gate from the channel, source and drain regions. Holes are then etched in the thick oxide layer covering the source and drain regions. Metal is then deposited over the thin layer of oxide to form the gate of the FET and over the previously etched holes in the thick oxide layer to form the contacts for the source and drain.

Prior art methods of fabricating such FETs are disadvantageous in that multiple steps are required to produce the thin layer of oxide over the channel region and the thick oxide layer over the drain and source regions of the FET. Further, misalignment of the thin layer of oxide may occur, thus causing part of either the drain or source region to be covered by only the thin layer of oxide intended to cover the channel region. When such a misalignment occurs the surface metal which forms the gate is separated from either the drain or source by only the thin layer of oxide in the overlap area, resulting in an increased capacitance between the drain or source region and the gate. Such an increased capacitance, especially if it exists between the drain region and the gate, severely reduces the operational speed of the FET.

Accordingly, the principal objects of this invention are to reduce the number of steps required to fabricate FETs in MOS integrated circuits, and to minimize the overlap between the thin layer of oxide and the drain and source regions, thus minimizing capacitance and improving the operating speed of the FET. Other and incidental objects of the present invention will become apparent from a study of the following detailed description.

These objects are accomplished in accordance with the preferred embodiment of the invention by employing a single fabrication step to simultaneously produce both the thick oxide layer over the drain and source of the FET and the thin layer of oxide over the channel of the FET. Unlike the prior art in which multiple steps are required to produce both the thick and thin oxide layers, this single fabrication step advantageously employs the difference, under certain temperature conditions, between the growth rate of oxide on silicon into which phosphorous has been heavily doped and the growth rate of oxide on non-doped or lightly doped silicon. When the temperature of the silicon substrate is below 1000° C, silicon oxide ($SiO_2$) is found to grow in the region where phosphorous has been heavily diffused at a rate substantially faster than the rate at which oxide grows on the non-doped or lightly doped silicon. This growth rate differential allows the channel region and the drain and source regions of the FET to be oxidized simultaneously in a single step, and oxide layers of the desired thicknesses to be produced. Excessive capacitance between the drain and gate, caused by misalignment of of the thin layer of oxide over the channel in the prior art methods of fabrication, is eliminated by the present invention since the thick oxide layer required over the drain and source regions of the FET inherently coincides with the regions of phosphorous diffusion, thus eliminating reliance on physical alignment of external equipment.

DESCRIPTION OF THE PREFERRED EMBODIMENT

Referring now to FIGS. 1A–F there is shown a cross section of a silicon substrate into which a field effect transistor (FET) is fabricated by prior art techniques.

Figure 1A:
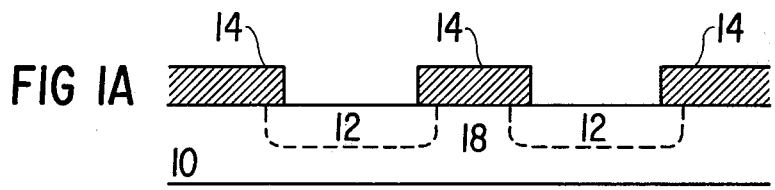
FIG. 1A–F illustrate the steps in a prior art method of fabricating field effect transistors in metal oxide semiconductor integrated circuits.
Figure 1B:
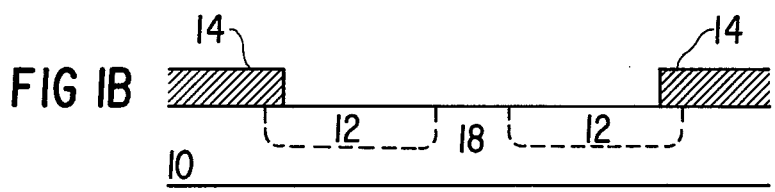
Figure 1C:
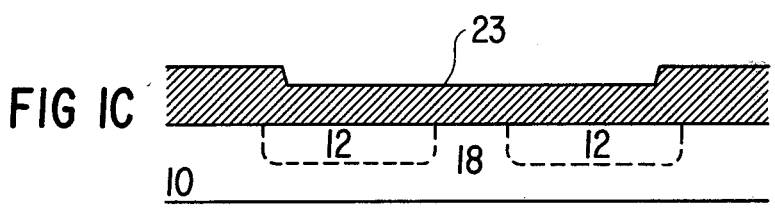

FIG. 1A shows a cross section of a substrate 10 of the p-type silicon with two n-type regions 12 into which phosphorous has been diffused to produce regions of n-type semiconductor material. Diffusion is effected through windows etched through a protective layer of silicon oxide 14 previously grown on the surface of the substrate 10. The concentration of phosphorous dopant diffused into the two n-type regions 12 is preferably greater than $3 \times 10^{19}$ atoms/cm³. The two n-type regions 12 into which phosphorous is diffused are separated by a channel 18 where diffusion is prevented by the protective layer of silicon oxide 14. The two n-type regions 12 where phosphorous has been diffused will become the source and the drain of the FET. In FIG. 1B the protective layer of silicon oxide 14 protecting the channel 18 has been etched away to prepare the substrate 10 for subsequent oxide growth. FIG. 1C illustrates a thick oxide layer 23 grown over the two n-type regions 12 and the channel 18.

Figure 1D:
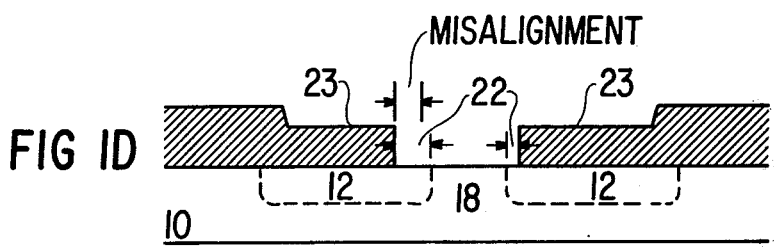
Figure 1E:
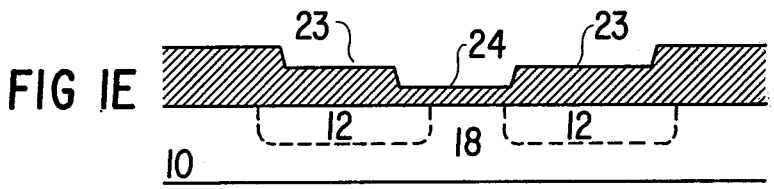

FIG. 1D shows the thick oxide layer 23 of FIG. 1C in which a window has been etched over the channel 18. The etching of this window commonly results in a misalignment which creates undesirable overlap area 22 between the window in the thick oxide layer 23 and one of the two n-type regions 12 of the FET. Referring now to FIG. 1E, there is shown a cross section of the substrate 10 of FIG. 1D after a thin layer of oxide 24 has been grown over the channel 18 exposed by the window etched in the thick oxide layer 23 of FIG. 1D. Growth of the thin layer of oxide 24 typically results in additional oxide growth over the existing thick oxide layer 23 covering the two n-type regions 12 of the FET.

Figure 1F:
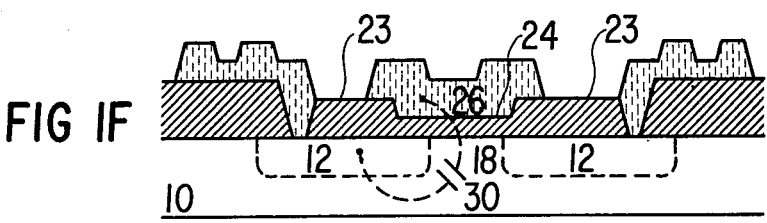

Referring now to FIG. 1F, there is shown a portion of the final step in the manufacture of the prior art FET, in which the gate 26 is formed by depositing a layer of metal on the thin layer of oxide 24. If misalignment has occurred in the fabrication step illustrated in FIG. 1D, the gate 26 will be separated from one of the two n-type regions 12 of the FET by only the thin layer of oxide 24 in the overlap area 22. This close proximity creates a capacitance 30 between the gate 26 and the nearer of the two n-type regions 12, and may degrade the speed of operation of the FET. Capacitance 30 may represent either a gate-drain capacitance or a gate-source capacitance depending upon the circuit configuration in which the FET is employed. If the circuit in which the FET is employed involves a significant voltage gain, the effect of capacitance 30 may be increased substantially by the Miller effect, and will severely limit the speed of operation of the FET.

Figure 2A:
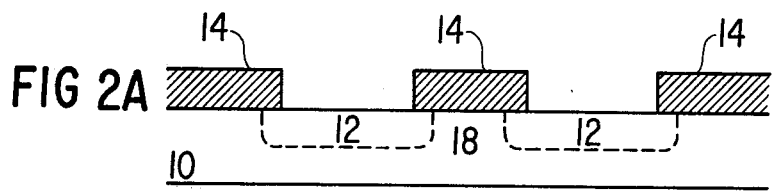
FIGS. 2A–D illustrate the steps required to manufacture field effect transistors in metal oxide semiconductor integrated circuits in accordance with the present invention.
Figure 2B:
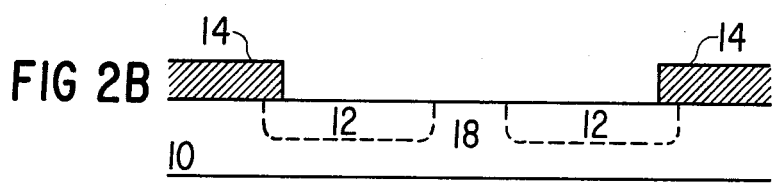
Figure 2C:
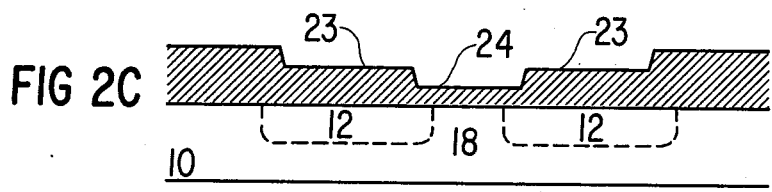
Figure 2D:
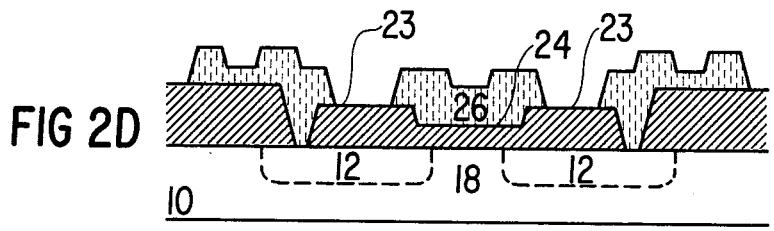

Referring now to FIGS. 2A–D, there is shown a cross section of the substrate 10 as the FET is fabricated in accordance with the preferred embodiment of the present invention. FIGS. 2A, 2B and 2D, are identical to FIGS. 1A, 1B, and 1F, respectively, described above, except that no overlap area 22 occurs in the process of the present invention.

Referring now to FIG. 2C, there is shown a single step to simultaneously fabricate both the thin layer of oxide 24 over the channel 18 and the thick oxide layer 23 over the two n-type regions 12 of the FET. It has been observed that at temperatures below 1000° C, the rate of growth of oxide over areas of silicon which have been heavily doped with phosphorous to a concentration preferably greater than $3 \times 10^{19}$ atoms/cm$^3$ is substantially greater than the rate of growth of oxide over areas of non-doped or lightly-doped silicon.

It appears that phosphorous doping increases the surface reaction rate at the SiO$_2$-Si interface. At high temperatures the surface reaction rate is greater than the rate at which oxidant can diffuse through the SiO$_2$ and therefore little differentiation between growth rates occurs, the growth rate being controlled by the oxidant diffusion rate. At lower temperatures the surface reaction rates are less than the oxidant diffusion rates and the different surface reaction rates, which vary with temperature, control the rate of oxide growth. Increasing the pressure of the oxidant would increase the oxidant diffusion rate, but since the surface reaction rates are nearly identical at temperatures over 1200° C this would not produce the desired affect. As the temperature is lowered an increasing differential in growth rates is observed but the rate of growth also decreases making temperatures lower than about 500° C impractical.

The improved method of manufacture of FETs illustrated in 2C involves the preferred condition wherein the silicon substrate is exposed to the oxidation medium at approximately 850° C. At this temperature, the differential growth rate of the oxide over the two phosphorous-doped n-type regions 12, and the undoped channel 18, is such that, when the required thin layer of oxide 24 is obtained over the channel 18, the thick oxide layer 23 over the two n-type regions 12 has simultaneously grown to a greater thickness. Typical thickness ratios are from approximately 4.7:1 to 5:1. Employment of this differential growth rate replaces three steps, illustrated in FIGS. 1C–1E, of the prior art fabrication technique with a single fabrication step, Illustrated in FIGS. 1C–1E, of the prior art fabrication technique with a single fabrication step, illustrated in FIG. 2C.

In addition to saving fabrication steps, the present method of manufacturing FETs produces an improved FET, due to the elimination of alignment errors associated with FETs manufactured by prior art methods involving more fabrication steps. The area in which a thin layer of oxide 24 is grown always coincides with the channel 18, and, since its limits are defined by the n-type regions 12 doped with phosphorous, rather than by the prior art etching process typically employing photo lithographic techniques, the thin layer of oxide 24 will never have the overlap area 22 lying between it and one of the two n-type regions 12 that frequently occur when a window is etched, as illustrated in FIG. 1D. Thus, gate-to-drain and gate-to-source capacitance are minimized, and the operating speed of the FET is significantly increased.

I claim:

1. A method for fabricating a metal oxide semiconductor field effect transistor, the method comprising:
    diffusing a phosphorous dopant into both a drain region and a source region of a silicon semiconductor substrate to produce a selected concentration of phosphorous in the drain and source regions;
    exposing a channel region of the silicon semiconductor substrate and simultaneously exposing the drain and source regions to an oxidizing medium at a temperature less than 1000° C. to form an oxide layer over the channel region;
    forming a gate electrode contacting the oxide layer over said channel region; and
    forming openings through the oxide layer to attach electrodes to the drain and source regions.

2. A method as in claim 1 wherein said exposing step is performed at a temperature between 600° and 900° C.

3. A method as in claim 1 wherein said exposing step is performed at a temperature between 825° and 875° C.

4. A method as in claim 1 wherein the selected concentration of phosphorous is between $3 \times 10^{18}$ and $3 \times 10^{20}$ atoms/cm$^3$.

5. A process for fabricating a metal oxide field effect transistor comprising the steps, performed in sequence, of:
    depositing a diffusion barrier on the surface of a silicon semiconductor substrate;
    forming openings in the diffusion barrier to expose the silicon semiconductor substrate over source and drain regions;
    diffusing a phosphorous dopant into both the drain region and the source region of the silicon semiconductor substrate to produce a selected concentration of phosphorous in the drain and source regions;
    removing the diffusion barrier from the silicon semiconductor substrate over a channel region between the source and drain regions;
    exposing the channel region, and simultaneously exposing the drain region and the source region to an oxidizing medium at a temperature less than 1000° C. to form an oxide layer over the channel region; and
    forming openings through the oxide layer to attach electrodes to the drain and source regions.

6. A process as in claim 5 wherein said exposing step is performed at a temperature between 600° and 900° C.

7. A process as in claim 5 wherein said exposing step is performed at a temperature between 825° and 875° C.

8. A process as in claim 5 wherein the selected concentration of phosphorous is between $3 \times 10^{18}$ and $3 \times 10^{20}$ atoms/cm$^3$.

* * * * *